(12) United States Patent
Nilsson

(10) Patent No.: US 10,171,043 B2
(45) Date of Patent: Jan. 1, 2019

(54) AMPLIFICATION DEVICE INCORPORATING LIMITING

(71) Applicant: Telefonaktiebolaget LM Ericsson (publ), Stockholm (SE)

(72) Inventor: Magnus Nilsson, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 15/763,861

(22) PCT Filed: Oct. 5, 2015

(86) PCT No.: PCT/EP2015/072890
§ 371 (c)(1),
(2) Date: Mar. 28, 2018

(87) PCT Pub. No.: WO2017/059880
PCT Pub. Date: Apr. 13, 2017

(65) Prior Publication Data
US 2018/0287570 A1   Oct. 4, 2018

(51) Int. Cl.
*H04B 1/16* (2006.01)
*H03F 1/52* (2006.01)
(Continued)

(52) U.S. Cl.
CPC ............. *H03F 1/523* (2013.01); *H03F 3/193* (2013.01); *H03F 3/45179* (2013.01);
(Continued)

(58) Field of Classification Search
None
See application file for complete search history.

(56) References Cited

U.S. PATENT DOCUMENTS 3,666,970 A * 5/1972 Abbott ............... G01R 19/1658
327/180
3,944,167 A * 3/1976 Figler ..................... G01S 3/786
244/3.16
(Continued)

FOREIGN PATENT DOCUMENTS

JP        H107162246 A     6/1995

OTHER PUBLICATIONS

What-When-How.Com, "Circuit Design (GPS) Part 3", pp. 1-7, retrieved on Jul. 23, 2015, retrieved from Internet http://what-when-how.com/gps-galileo-dual-rf-front-end-receiver-and-design-fabrication-and-test/circuit-design-gps-part-3/.
(Continued)

*Primary Examiner* — Lana N Le
(74) *Attorney, Agent, or Firm* — Coats and Bennett, PLLC

(57) ABSTRACT

An amplification device (100) comprises an amplifier circuit (110) and a limiter (120). The amplifier circuit (110) comprises a signal input (111) for an input signal to be amplified and a first signal output (112) for a first output signal. The limiter (120) comprises a differential amplifier (125) comprising a first differential amplifier input (129) for a threshold control signal, a second differential amplifier input (113) for a feedback signal, and a differential amplifier output (124) for a threshold signal indicative of a difference between the threshold control signal and the feedback signal. The limiter (120) also comprises a first diode (121) having a first anode (122) coupled to the first signal output (112) and a first cathode (123) coupled to the differential amplifier output (124), and a feedback stage (128) coupled between the differential amplifier output (124) and the second differential amplifier input (113). The feedback stage
(Continued)

(128) is arranged to generate the feedback signal dependent on the threshold signal.

18 Claims, 6 Drawing Sheets

(51) Int. Cl.
  *H03F 3/193* (2006.01)
  *H03F 3/45* (2006.01)
  *H03G 3/30* (2006.01)
(52) U.S. Cl.
  CPC ............ *H03G 3/3036* (2013.01); *H04B 1/16* (2013.01); *H03F 2200/294* (2013.01); *H03F 2200/372* (2013.01); *H03F 2203/45116* (2013.01); *H03F 2203/45526* (2013.01)

(56) References Cited

U.S. PATENT DOCUMENTS

| | | | | |
|---|---|---|---|---|
| 3,991,370 A | * | 11/1976 | Pate | H03G 3/3005 455/108 |
| 5,497,403 A | * | 3/1996 | Harada | H03G 7/00 455/76 |
| 5,602,771 A | * | 2/1997 | Kajigaya | G11C 5/025 365/51 |
| 5,603,105 A | * | 2/1997 | Iwahashi | H03G 3/3005 455/110 |
| 5,737,432 A | * | 4/1998 | Werrbach | H03G 9/025 381/100 |
| 5,771,301 A | * | 6/1998 | Fuller | H03G 7/002 381/104 |
| 5,955,921 A | * | 9/1999 | Ide | H03G 3/3084 330/136 |
| 5,973,561 A | | 10/1999 | Heaton | |
| 6,208,209 B1 | | 3/2001 | Ng | |
| 6,448,860 B1 | * | 9/2002 | Wolter | H03F 1/301 250/214 A |
| 6,762,647 B1 | | 7/2004 | Apel | |
| 7,280,330 B2 | | 10/2007 | Oguzman et al. | |
| 7,539,613 B2 | * | 5/2009 | Takada | G10L 21/038 455/118 |
| 8,712,066 B1 | * | 4/2014 | Baker | H03F 1/32 381/120 |
| 9,124,084 B2 | * | 9/2015 | Shinde | H02H 9/00 |
| 9,729,951 B2 | * | 8/2017 | Wolf | H04R 1/00 |
| 2006/0066412 A1 | | 3/2006 | Mohammadi | |
| 2007/0286611 A1 | * | 12/2007 | Weber | H04B 10/693 398/202 |
| 2011/0089989 A1 | * | 4/2011 | Furumiya | H03G 11/002 327/327 |
| 2012/0329418 A1 | | 12/2012 | Chang et al. | |
| 2015/0200633 A1 | | 7/2015 | Yang et al. | |
| 2015/0311785 A1 | * | 10/2015 | Kim | H02M 3/07 327/536 |

OTHER PUBLICATIONS

Wikipedia, "Clamper (electronics)," pp. 1-4, retrieved Jul. 23, 2015, retrieved from Internet: https://en.wikipedia.org/wiki/Clamper_(electronics).

Daenotes, "Clipper & Clamper," pp. 1-2, Category: Microwave & Radar, retrieved Jul. 23, 2015, retrieved from Internet: https://www.daenotes.com/electronics/devices-circuits/clipper-clamper.

\* cited by examiner

AMPLIFICATION DEVICE INCORPORATING LIMITING

FIELD OF THE DISCLOSURE

The present disclosure relates to an amplification device, a receiving apparatus comprising the amplification device, and a radio communication apparatus comprising the receiving apparatus, and has application in particular, but not exclusively, to radio frequency integrated circuits.

BACKGROUND TO THE DISCLOSURE

Radio frequency integrated circuits (RFICs) include increasing amounts of digital processing which, because radio frequency (RF) spectrum is a scarce resource, are required to operate in higher and higher frequency bands. For example, recently, frequency bands in the range 3 to 6 GHz are being deployed for the third generation partnership project (3GPP). In addition, target power consumption is continually being reduced. In response to these factors, RFICs are being implemented in deep complementary metal oxide semiconductor (CMOS) nodes using, for example, 28 nm technology.

Using deep CMOS nodes for RF design generates some problems due to the limited voltage handling of the transistors. One particular difficulty is low noise amplifier (LNA) design. Fast transistors are required in order to obtain low noise and high bandwidth in the LNA, and a high gain is required to suppress the noise of circuits following the LNA. Commonly, a resonator load is used at the LNA output, to enable high voltage gain and high output signal swing.

An increasing requirement is for multi-standard RFICs, particularly for mobile phones that support dual-call and/or WiFi. A User Equipment (UE) supporting multiple simultaneous 3GPP systems and/or WiFi might generate significant interference to its own receivers due to crosstalk between antennas. To reduce cost, it is desirable to minimise the filtering of signals at the input of a receiver, but this can lead to crosstalk that may cause high signal levels inside LNAs and damage them.

A particularly challenging scenario is a small cell base station deployed indoors. In this scenario, some UEs may be connected to an indoor system while other UEs are connected to an outdoor system, for example using an operator not available indoors, with all UEs potentially operating in the same frequency band. A UE connected to the outdoor system will transmit at a much higher output power than those connected to the indoor system, in order to be able to reach the outdoor base stations. This could cause high levels of interference in the LNAs of the indoor base station, sufficient to damage them. A UE connected to the outdoor system may act as a blocker to the indoor system and degrade all communication in that frequency band.

Another challenging scenario relates to beam forming radios, where preferably no filters are used before the LNA as a high number of antennas may be employed, for example in the order of a hundred. In this case high power out-of-band signals may enter the LNA and damage it.

There is a requirement for improvements in amplification.

SUMMARY OF THE PREFERRED EMBODIMENTS

According to a first aspect there is provided an amplification device comprising:
an amplifier circuit and a limiter;
wherein the amplifier circuit comprises a signal input for an input signal to be amplified and a first signal output for a first output signal; and
wherein the limiter comprises:
a differential amplifier comprising a first differential amplifier input for a threshold control signal, a second differential amplifier input for a feedback signal, and a differential amplifier output for a threshold signal indicative of a difference between the threshold control signal and the feedback signal;
a first diode having a first anode coupled to the first signal output and a first cathode coupled to the differential amplifier output; and
a feedback stage coupled between the differential amplifier output and the second differential amplifier input, wherein the feedback stage is arranged to generate the feedback signal dependent on the threshold signal.

Therefore, limiting may be applied at the first signal output, using a threshold dependent on the difference between the threshold control signal and the feedback signal. The amplification device can provide protection against damage to the amplifier circuit by providing limiting at the first signal output, whilst enabling reduced degradation of a wanted signal by providing the limiting only when needed for protection. The threshold control signal may be chosen to set the threshold of limiting to suit prevailing conditions. The use of feedback to establish the threshold signal enables the threshold signal to be set precisely and to be constant. The use of feedback to establish the threshold signal also enables the onset of limiting, when the input signal level increases, to be fast without significant hysteresis and without generating significant transient signals. Likewise, when the input signal level decreases below the level at which limiting occurs, the use of feedback enables the resumption of linear operation to occur without significant hysteresis and without generating significant transient signals.

The threshold control signal may be provided from a source external to the amplification device. Alternatively, in some embodiments, the limiter may comprise a threshold controller arranged to generate the threshold control signal dependent on a property of the amplifier circuit. This feature enables improved performance by enabling the threshold signal to be adapted to prevailing conditions or to the characteristics of the amplifier circuit, in particular to maximise the threshold of limiting whilst minimising the likelihood of damage to the amplifier circuit. In one example, the property of the amplifier circuit may be temperature of the amplifier. This enables the threshold signal to be adapted according to temperature changes circuit. In another example, the property of the amplifier circuit may be an integrated circuit process corner. This enables the threshold signal to be adapted according to the electrical characteristics of circuit components of the amplifier circuit.

The differential amplifier may comprise a detector stage arranged to generate an averaged signal indicative of an average of a difference between the threshold control signal and the feedback signal, the amplification device may further comprises a gain control stage arranged to generate a gain control signal dependent on the averaged signal, and the amplifier circuit may be arranged to have a gain dependent on the gain control signal. This feature, whereby limiting and gain control may be used in combination, enables the amplifier circuit to be protected from being damaged by peak levels of an input signal that has a high peak-to-average power ratio (PAPR), which may be a wanted signal or interference, without using a low threshold of limiting, which may degrade performance, and enables a wide dynamic range and enables fast operation of limiting.

The gain control stage may be arranged to control the gain control signal such that the gain of the amplifier circuit is increased in response to the averaged signal being indicative of the input signal having a level below a lower signal level threshold, is decreased in response to the averaged signal being indicative of the input signal having a level above an upper signal level threshold, and is unchanged in response to the averaged signal being indicative of the input signal having a level between the lower signal level threshold and the upper signal level threshold. This feature enables hysteresis to be employed, thereby avoiding frequent changes of gain of the amplifier circuit, which may degrade performance.

The detector stage may be arranged to employ an adjustable time constant for generating the averaged signal, and the limiter may further comprise a time constant controller coupled to the detector stage and arranged to adjust the adjustable time constant dependent on a property of the input signal to be amplified. This feature enables improved performance. In one embodiment, the property of the input signal may be type of modulation. In another embodiment, the property of the input signal may be signal-to-interference ratio.

The differential amplifier may comprise a differential input stage and an output stage, wherein a first input of the differential input stage is coupled to the first differential amplifier input and a second input of the differential input stage is coupled to the second differential amplifier input, wherein an input of the output stage is coupled to an output of the differential input stage and an output of the output stage is coupled to the difference output of the differential amplifier, and the detector stage may be coupled to the output of the differential input stage for determining the averaged signal. This feature enables the averaging by the detector stage to be performed independently of the output stage and therefore without affecting the threshold signal delivered from the output stage.

The detector stage may be arranged to replicate a current flowing in the output stage by generating a current proportional to a current flowing in the output stage, and may be arranged to generate the averaged signal from the replica. This feature enables the gain control of the amplifier circuit to accurately reflect changes in the threshold signal, and thereby accurately reflect the level of the input signal.

The amplifier circuit may comprise a second signal output for a second output signal, the first and second output signals together forming a differential signal, and the limiter may comprise a second diode having a second anode coupled to the second signal output and a second cathode coupled to the differential amplifier output. This feature enables the amplification device to be used for delivering a differential signal.

The feedback stage may comprise a capacitive element coupled between the differential amplifier output and a first voltage supply rail. This feature enables transients in the threshold signal to be reduced.

The feedback stage may comprise a first resistive element coupled between the differential amplifier output and the second differential amplifier input, and a second resistive element coupled between the second differential amplifier input and a second power supply rail. This feature enables the differential amplifier to operate with low signal levels, and therefore have low power consumption.

The amplifier circuit may be a low noise amplifier (LNA). Such an amplifier may therefore be deployed in the front end of a radio receiver. Indeed, according to a second aspect, there is provided a receiving apparatus comprising the amplification device according to the first aspect. According to a third aspect, there is provided a radio communication apparatus comprising the receiving apparatus according to the second aspect. In one embodiment, the radio communication apparatus may be a base station. In another embodiment, the radio communication apparatus may be a mobile phone.

According to a fourth aspect, there is provided a method of operating an amplification device, comprising:

amplifying an input signal in an amplifier circuit to provide a first output signal at a first output of the amplifier circuit;

applying a threshold control signal to a first input of a differential amplifier;

applying a feedback signal to a second input of the differential amplifier;

generating a threshold signal at an output of the differential amplifier indicative of a difference between the threshold control signal and the feedback signal;

generating the feedback signal dependent on the threshold signal; and limiting the first output signal by means of a first diode having a first anode coupled to the first output of the amplifier circuit and a first cathode coupled to the output of a differential amplifier.

Amplifying the input signal may further comprise providing a second output signal at a second output of the amplifier circuit, wherein the first and second output signals together form a differential signal, and the method may further comprise limiting the second output signal by means of a second diode having a second anode coupled to the second output of the amplifier circuit and a second cathode couple to the output of the differential amplifier.

Preferred embodiments are described, by way of example only, with reference to the accompanying drawings.

DETAILED DESCRIPTION OF PREFERRED EMBODIMENTS

Figure 1:
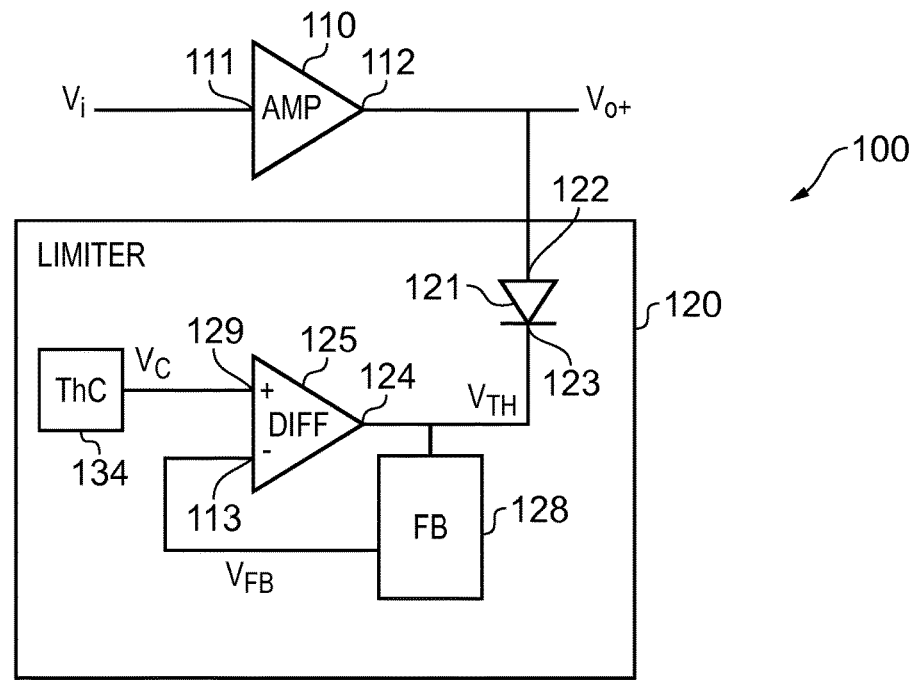
FIG. 1 is a schematic diagram of an amplification device.

Referring to FIG. 1, an amplification device 100 arranged for amplifying a single-ended signal comprises an amplifier circuit (AMP) 110, which may be an LNA, and a limiter 120. The amplifier circuit 110 has a signal input 111 for an input signal $V_i$ to be amplified and a first signal output 112 for a first output signal $V_{O+}$. The signal input 111 is arranged for receiving the input signal $V_i$ in a single-ended format, although in other embodiments the signal input 11 may be arranged for receiving the input signal $V_i$ in a differential format. The signal input 111 of the amplifier circuit 110 is also a signal input of the amplification device 100, and the first signal output 112 is also a signal output of the amplification device 100. The limiter 120 has a differential amplifier 125. The differential amplifier 125 comprises a first differential amplifier input 129 for a threshold control signal $V_C$, a second differential amplifier input 113 for a feedback signal $V_{FB}$, and a differential amplifier output 124 for a threshold signal $V_{TH}$ indicative of a difference between the threshold control signal $V_C$ and the feedback signal $V_{FB}$. In this embodiment, the first differential amplifier input 129 is a non-inverting input and the second differential amplifier input 113 is an inverting input. Typically the threshold control signal $V_C$ and the feedback signal $V_{FB}$ are voltages. A first diode 121 has a first anode 122 coupled to the first signal output 112 of the amplifier circuit 110 and a first cathode 123 coupled to the differential amplifier output 124. Diodes are commonly available in integrated circuits for electrostatic discharge (ESD) protection, and the first diode 121 may be such a diode, scaled down in size, if desired, to reduce parasitic capacitance and therefore impact on tuning range. A feedback stage 128 is coupled between the differential amplifier output 124 and the second differential amplifier input 113, and is arranged to generate the feedback signal $V_{FB}$ dependent on the threshold signal $V_{TH}$ at the differential amplifier output 124. Some possible architectures of the feedback stage 128 are described below.

In operation, for relatively low voltage levels of the input signal $V_i$, the first output signal $V_{O+}$ has a low level, the first diode 121 is reversed biased and the input signal $V_i$ is amplified without any limiting occurring. In this condition, the threshold signal $V_{TH}$ has a constant quiescent level determined by the threshold control signal $V_C$. When the amplitude of the input signal $V_i$ increases, such that the level of the first output signal $V_{O+}$ exceeds the threshold signal $V_{TH}$ plus the forward bias voltage of the first diode 121, the first diode 121 starts to conduct during peaks of the input signal $V_i$, which results in the level of the threshold signal $V_{TH}$ at the differential amplifier output 124 rising. Consequently, the feedback signal $V_{FB}$ increases, and by operation of the differential amplifier 125, the threshold signal $V_{TH}$ is restored to its quiescent level, such that the amplitude of the first output signal $V_{O+}$ is limited to the quiescent level of the threshold signal $V_{TH}$ plus the forward bias voltage of the first diode 121.

When the input signal $V_i$ is relatively large, the differential amplifier 125 may have to sink a high current, for example several milliamps. In order to avoid a high current for long periods of time when the input signal $V_i$ is small for a long period of time, the differential amplifier 125 may have an output stage biased in class AB, which can enable the current in the differential amplifier 125 to be low, for example in the range 100 µA to 200 µA.

In the amplification device 100 described with reference to FIG. 1, the limiter 120 also comprises a threshold controller (ThC) 134 that is arranged to generate the threshold control signal $V_C$. Therefore, in this embodiment, the threshold control signal $V_C$ is provided by a threshold controller 134 that is an integral element of the amplification device 100, whereas in other embodiments the threshold controller 134 may be omitted, in which case the threshold control signal $V_C$ may be provided by a device external to the amplification device 100.

The threshold controller 134 may be arranged to generate the threshold control signal $V_C$ dependent on a property of the amplifier circuit 110. For example, such a property of the amplifier circuit 110 may be temperature of the amplifier circuit 110, in which case the threshold controller 134 may be arranged to measure temperature of the amplifier circuit 110 and to determine the threshold control signal $V_C$ dependent on the measured temperature. As another example, such a property of the amplifier circuit 110 may be a process corner of an integrated circuit in which the amplifier circuit 110, or the amplification device 100, is implemented, in which case the threshold controller 134 may be arranged to measure a parameter of the integrated circuit that is indicative of the process corner, such as a free-running ring oscillator clock frequency, as faster integrated circuits are more susceptible to over voltage, and to determine the threshold control signal $V_C$ dependent on the measured parameters. More particularly, the property of the amplifier circuit 110 may be a property of one or more transistors within the amplifier circuit 110, in which case the property may be, for example, temperature of the transistor(s), or the threshold controller 134 may be arranged to measure a parameter of the transistor(s) that is indicative of the process corner.

Figure 2:
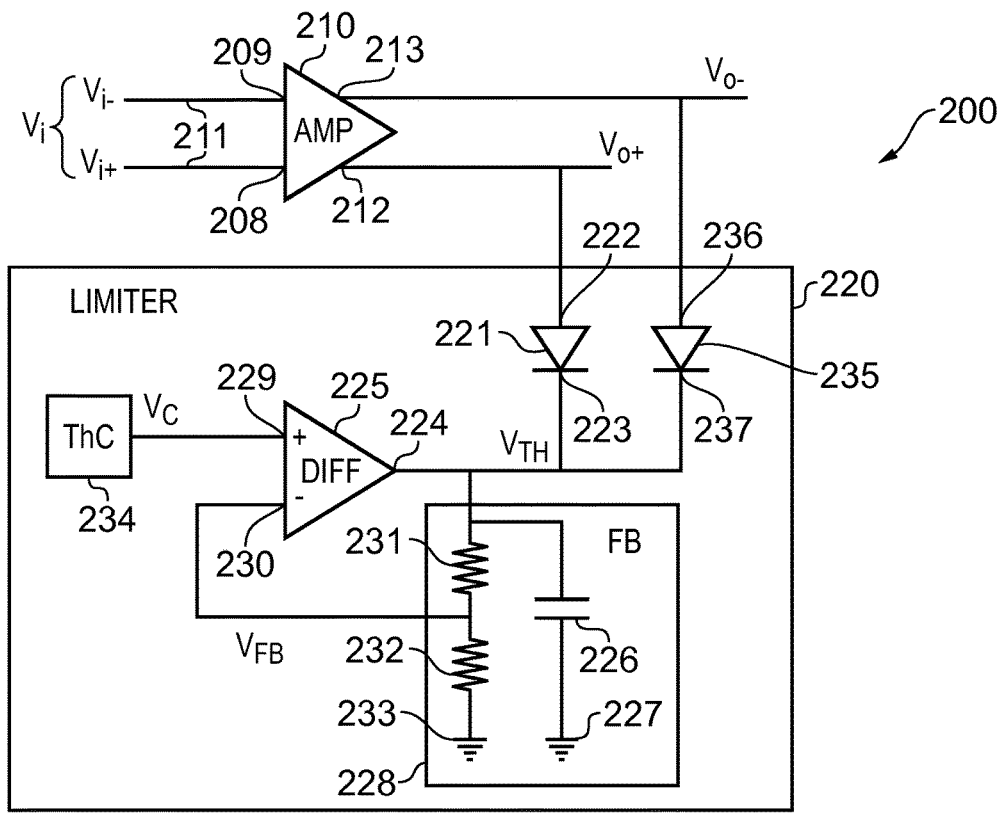
FIG. 2 is a schematic diagram of an amplification device.

Referring to FIG. 2, an amplification device 200 comprises an amplifier circuit 210 and a limiter 220. The amplifier circuit 210 has a signal input 211 for an input signal $V_i$ to be amplified. The signal input 211 comprises a first signal input 208 for a first input signal component, or first input signal part, $V_{i+}$ of the input signal $V_i$, and a second signal input 209 for a second input signal component, or second input signal part, $V_{i-}$ of the input signal $V_i$, the first and second input signal components $V_{i+}$, $V_{i-}$ being an inversion of each other. The first and second input signal components $V_{i+}$, $V_{i-}$ form a differential signal. In other embodiments the signal input 211 may be arranged for a single ended input signal $V_i$. The amplifier circuit 210 also comprises a first signal output 212 for a first output signal $V_{O+}$, and a second signal output 213 for a second output signal $V_{O-}$. The first and second output signals $V_{O+}$, $V_{O-}$ form a differential signal, with the first and second output signals $V_{O+}$, $V_{O-}$ being an inversion of each other, at least when no limiting is taking place. The signal input 211 of the amplifier circuit 210 is also a signal input of the amplification device 200, and the first and second signal outputs 212, 213 are also first and second signal outputs of the amplification device 200. The limiter 220 has a differential amplifier 225. The differential amplifier 225 comprises a first differential amplifier input 229 for a threshold control signal $V_C$, a second differential amplifier input 230 for a feedback signal $V_{FB}$, and a differential amplifier output 224 for a threshold signal $V_{TH}$ indicative of a difference between the threshold control signal $V_C$ and the feedback signal $V_{FB}$. In this embodiment, the first differential amplifier input 229 is a non-inverting input and the second differential amplifier input 230 is an inverting input. Typically the threshold control signal $V_C$ and the feedback signal $V_{FB}$ are voltages. A first diode 221 has a first anode 222 coupled to the first signal output 212 of the amplifier circuit 210 and a first cathode 223 coupled to the differential amplifier output 224. A second diode 235 has a second anode 236 coupled to the second signal output 213 of the amplifier circuit 210 and a second cathode 237 coupled to the differential amplifier output 224. A feedback stage 228 is coupled between the differential amplifier output 224 and the second differential amplifier input 230, and is arranged to generate the feedback signal $V_{FB}$ dependent on the threshold signal $V_{TH}$ at the differential amplifier output 224. The feedback stage 228 comprises a capacitive element 226 coupled between the differential amplifier output 224 and a first voltage supply rail 227, which in this embodiment is at ground potential. In addition, the feedback stage 228 comprises a first resistive element 231 coupled between the differential amplifier output 224 and the second differential amplifier input 230, and a second resistive element 232 coupled between the second differential amplifier input 230 and a second power supply rail 233, which in this embodiment is at ground potential.

In operation, for relatively low voltage levels of the input signal $V_i$, the first output signal $V_{O+}$ has a low level, the first diode 221 is reversed biased and the input signal $V_i$ is amplified without any limiting occurring. In this condition, the threshold signal $V_{TH}$ has a constant quiescent level determined by the threshold control signal $V_C$. When the amplitude of the input signal $V_i$ increases such that the level of the first output signal $V_{O+}$ increases above the threshold signal $V_{TH}$ plus the forward bias voltage of the first diode 221, the first diode 221 starts to conduct, which results in the level of the threshold signal $V_{TH}$ at the differential amplifier output 224 rising. Consequently, the feedback signal $V_{FB}$ increases, and by operation of the differential amplifier 225, the threshold signal $V_{TH}$ is restored to its quiescent level, such that the level of the first output signal $V_{O+}$ is limited to the quiescent level of the threshold signal $V_{TH}$ plus the forward bias voltage of the first diode 221. Likewise, when the amplitude of the second output signal $V_{O-}$ increases above the threshold signal $V_{TH}$ plus the forward bias voltage of the second diode 235, the second diode 235 starts to conduct, which results in the level of the threshold signal $V_{TH}$ at the differential amplifier output 224 rising. Consequently, the feedback signal $V_{FB}$ increases, and by operation of the differential amplifier 225, the threshold signal $V_{TH}$ is restored to its quiescent level, such that the level of the second output signal $V_{O-}$ is limited to the quiescent level of the threshold signal $V_{TH}$ plus the forward bias voltage of the second diode 235. Because the first and second output signals $V_{O+}$, $V_{O-}$ are both limited using the same threshold voltage $V_{TH}$, limiting of the first and second output signals $V_{O+}$, $V_{O-}$ will not occur simultaneously, and the limiting will not be applied symmetrically to both the first and second output signals $V_{O+}$, $V_{O-}$. Limiting is applied to the first or second output signals $V_{O+}$, $V_{O-}$ only when necessary to prevent one of these signals exceeding a chosen level, thereby enabling distortion of the first and second output signals $V_{O+}$, $V_{O-}$ to be minimised. The threshold signal $V_{TH}$ is used for limiting both the first and second output signals $V_{O+}$, $V_{O-}$, thereby applying the same threshold of limiting to both the first and second output signals $V_{O+}$, $V_{O-}$.

As for the differential amplifier 125 described with reference to FIG. 1, when the input signal $V_i$ is relatively small, the differential amplifier 225 may be able to sink a high current, for example several milliamps. In order to avoid a high current for long periods of time when the input signal $V_i$ is large for a long period of time, the differential amplifier 225 may have an output stage biased in class AB.

In the amplification device 200 described with reference to FIG. 2, the limiter 220 also comprises a threshold controller (ThC) 234 that is arranged to generate the threshold control signal $V_C$. As for the amplification device 100 described with reference to FIG. 1, the threshold control signal $V_C$ is provided by a threshold controller 234 that is an integral element of the amplification device 200, whereas in other embodiments the threshold controller 234 may be omitted, in which case the threshold control signal $V_C$ may be provided by a device external to the amplification device 200.

The threshold controller 234 may be arranged to generate the threshold control signal $V_C$ dependent on a property of the amplifier circuit 210. For example, such a property of the amplifier circuit 210 may be temperature of the amplifier circuit 210, in which case the threshold controller 234 may be arranged to measure temperature of the amplifier circuit 210 and to determine the threshold control signal $V_C$ dependent on the measured temperature. As another example, such a property of the amplifier circuit 210 may be a process corner of an integrated circuit in which the amplifier circuit 210, or the amplification device 200, is implemented, in which case the threshold controller 234 may be arranged to measure parameters of the integrated circuit, such as currents and voltages, that are indicative of the process corner and to determine the threshold control signal $V_C$ dependent on the measured parameters. More particularly, the property of the amplifier circuit 210 may be a property of one or more transistors within the amplifier circuit 210, such as the first, second, third and fourth transistors $T_1$, $T_2$, $T_3$, $T_4$ of the amplifier circuit 210 described below with reference to FIG. 5, in which case the property may be, for example, temperature of the transistor(s), or the threshold controller 234 may be arranged to measure a parameter of the transistor(s) that is indicative of the process corner.

The feedback stage 228 may have a different architecture than described above. For example, the capacitive element 226 and/or the second resistive element 232 may be omitted, either or both being replaced by an open circuit. In another example, the first resistive element 231 may be replaced by a short circuit, in which case the feedback stage 228 provides a direct coupling between the differential amplifier output 224 and the second differential amplifier input 230. In this example, the capacitive element 226 and/or the second resistive element 232 may remain present, or may be omitted, either or both being replaced by an open circuit. The feedback stage 128 of the amplification device 100 described with reference to FIG. 1 may have any of the architectures of the feedback stage 228 of the amplification device 200 described above.

Figure 3:
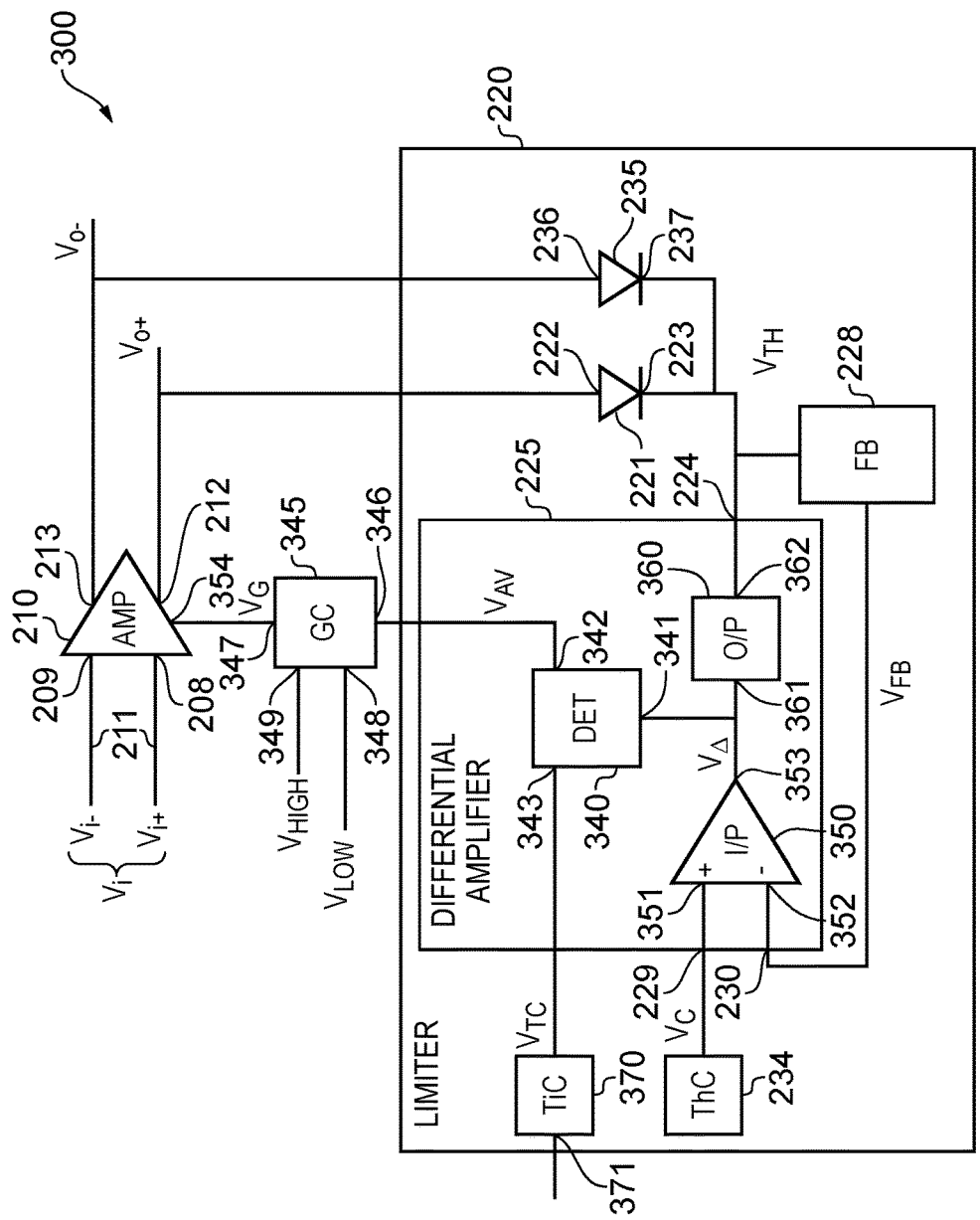
FIG. 3 is a schematic diagram of an amplification device.

Referring to FIG. 3, an amplification device 300 comprises all of the elements of the amplification device 200 described with reference to FIG. 2, and these elements will therefore not be described again below. Those elements of the amplification device 300 that are not also present in the amplification device 200 are described below. The amplification device 300 additionally comprises a gain controller (GC) 345, and the amplifier circuit 210 has a gain control input 354 by which the gain of the amplifier circuit 210 may be controlled. FIG. 3 also illustrates a typical architecture of the differential amplifier 225, which may also apply to the differential amplifier 125 of FIG. 1, although other architectures may be used instead.

Continuing to refer to FIG. 3, the differential amplifier 225 comprises a differential input stage (I/P) 350, a detector stage (DET) 340, and an output stage (O/P) 360. A first input 351 of the differential input stage 350 is coupled to the first differential amplifier input 229 for receiving the threshold control signal $V_C$, and a second input 352 of the differential input stage 350 is coupled to the second differential amplifier input 230 for receiving the feedback signal $V_{FB}$. In this embodiment, the first input 351 of the differential input stage 350 is a non-inverting input and the second differential amplifier input 352 is an inverting input. An output 353 of the differential input stage 350 delivers a difference signal $V_A$ that is indicative of the difference between the threshold control signal $V_C$ and the feedback signal $V_{FB}$. An input 361 of the output stage 360 is coupled to the output 353 of the differential input stage 350, and an output 362 of the output stage 360 is coupled to the difference output 224 of the differential amplifier 225 for delivering the threshold signal $V_{TH}$.

A first input 341 of the detector stage 340 is coupled to the output 353 of the differential input stage 350 for receiving the difference signal $V_A$. The detector stage 340 is arranged to generate an averaged signal $V_{AV}$ indicative of an average of the difference signal $V_\Delta$, and therefore indicative of an average of the difference between the threshold control signal $V_C$ and the feedback signal $V_{FB}$. The detector stage 340 may be arranged to replicate a current flowing in the output stage 360 by generating a current proportional to a current flowing in the output stage 360, and arranged to generate the averaged signal $V_{AV}$ by averaging the replica current. Such a replica current may be generated by using a replica transistor, that is, a transistor having dimensions scaled down with respect to the dimensions of a transistor of the output stage 360. The use of such a replica transistor and replica current can contribute to ensuring that the changes of gain of the amplifier circuit 210 accurately reflect the changes in amplitude of the input signal $V_i$. When the input signal $V_i$ increases in amplitude, either due to a wanted signal or to interference, the current flowing in the output stage 360 increases, and this increase can be detected in the difference signal $V_\Delta$, and therefore in the averaged signal $V_{AV}$.

An output 342 of the detector stage 340 is coupled to a first input 346 of the gain controller 345. The gain controller 345 generates a gain control signal $V_G$ dependent on the averaged signal $V_{AV}$ received from the detector stage 340. The gain control input 354 of the amplifier circuit 210 is coupled to an output 347 of the gain controller 345 for receiving the gain control signal $V_G$. By means of the gain control signal $V_G$, the gain controller 345 is arranged to control the gain of the amplifier circuit 210 dependent on the averaged signal $V_{AV}$, and therefore dependent on the difference signal $V_\Delta$ and dependent on the difference between the threshold control signal $V_C$ and the feedback signal $V_{FB}$. In this way, the gain controller 345 is arranged to control the gain of the amplifier circuit 210 dependent on a level of the input signal $V_i$.

In one embodiment, the gain controller 345 is arranged to decrease the gain of the amplifier circuit 210 if the averaged signal $V_{AV}$ is below a lower signal threshold $V_{LOW}$ is arranged to increase the gain of the amplifier circuit 210 if the averaged signal $V_{AV}$ is above a higher signal threshold $V_{HIGH}$, and is arranged to leave the gain of the amplifier circuit 210 unchanged whilst the averaged signal $V_{AV}$ is between the higher and lower signal thresholds $V_{HIGH}$, $V_{LOW}$. The lower signal threshold $V_{LOW}$ is lower than the higher signal threshold $V_{HIGH}$, and conversely the higher signal threshold $V_{HIGH}$ is higher than the lower signal threshold $V_{LOW}$. The use of the lower and higher signal thresholds $V_{LOW}$, $V_{HIGH}$ in this way can provide hysteresis to prevent the gain of the amplifier circuit 210 being switched frequently, which may degrade performance. Depending on how the averaging in the detector stage 340 is implemented, in other embodiments the gain controller 345 may be arranged to decrease the gain of the amplifier circuit 210 if the averaged signal $V_{AV}$ is above the higher signal threshold $V_{HIGH}$, is arranged to increase the gain of the amplifier circuit 210 if the averaged signal $V_{AV}$ is below the lower signal threshold $V_{LOW}$, and is arranged to leave the gain of the amplifier circuit 210 unchanged whilst the averaged signal $V_{AV}$ is between the higher and lower signal thresholds $V_{HIGH}$, $V_{LOW}$. More generally, the gain control stage 345 is arranged to control the gain control signal such that the gain of the amplifier circuit 210 is increased in response to the averaged signal $V_{AV}$ being indicative of the input signal $V_i$ having a level below a lower signal level threshold, is decreased in response to the averaged signal $V_{AV}$ being indicative of the input signal $V_i$ having a level above an upper signal level threshold, and is unchanged in response to the averaged signal $V_{AV}$ being indicative of the input signal $V_i$ having a level between the lower signal level threshold and the upper signal level threshold. The averaged signal $V_{AV}$ is indicative of changes in the level of the input signal $V_i$ because the threshold signal $V_{TH}$, and consequently the difference signal $V_\Delta$, changes dependent on the level of the input signal $V_i$ and therefore on the current flowing through the first and second diodes 221, 235. As illustrated in FIG. 3, the lower and higher signal thresholds $V_{LOW}$, $V_{HIGH}$ may be supplied to the gain controller 345 via respective second and third inputs 348, 349 of the gain controller 345. Alternatively, the lower and higher signal thresholds $V_{LOW}$, $V_{HIGH}$ may be stored in a memory device within, for example, the gain controller 345. By means of the gain control, a wide dynamic range can be provided in the amplification device 300 in conjunction with limiting to avoid peak signal levels damaging the amplification device 300.

In some embodiments, the detector stage 340 may be arranged to employ an adjustable time constant for performing averaging when generating the averaged signal $V_{AV}$. Such a feature is illustrated in FIG. 3. Referring to FIG. 3, the limiter 220 comprises a time constant controller (TiC) 370 arranged to generate a time constant control signal $V_{TC}$. The time constant controller (TiC) 370 is coupled to a second input 343 of the detector stage 340 for delivering the time constant control signal $V_{TC}$ to the detector stage 340. The time constant controller 370 is arranged to adjust the time constant control signal $V_{TC}$ dependent on a property of the input signal $V_i$ to be amplified by the amplifier circuit 210. In some embodiments, such a property of the input signal $V_i$ to be amplified by the amplifier circuit 210 may be the type of modulation of the signal, such that the time constant control signal $V_{TC}$ may be different for different modulation schemes. In another embodiments, such a property of the input signal $V_i$ may be signal-to-interference ratio, such that the time constant control signal $V_{TC}$ may be different for different target signal-to-interference ratios, or for different measured signal-to-interference ratios of the first and/or second output signals $V_{O+}$, $V_{O-}$ measured either before or after demodulation of the first and second outputs signals $V_{O+}$, $V_{O-}$. The time constant controller 370, therefore, has an optional input 371 for an indication of measured signal-to-interference ratio.

Figure 4:
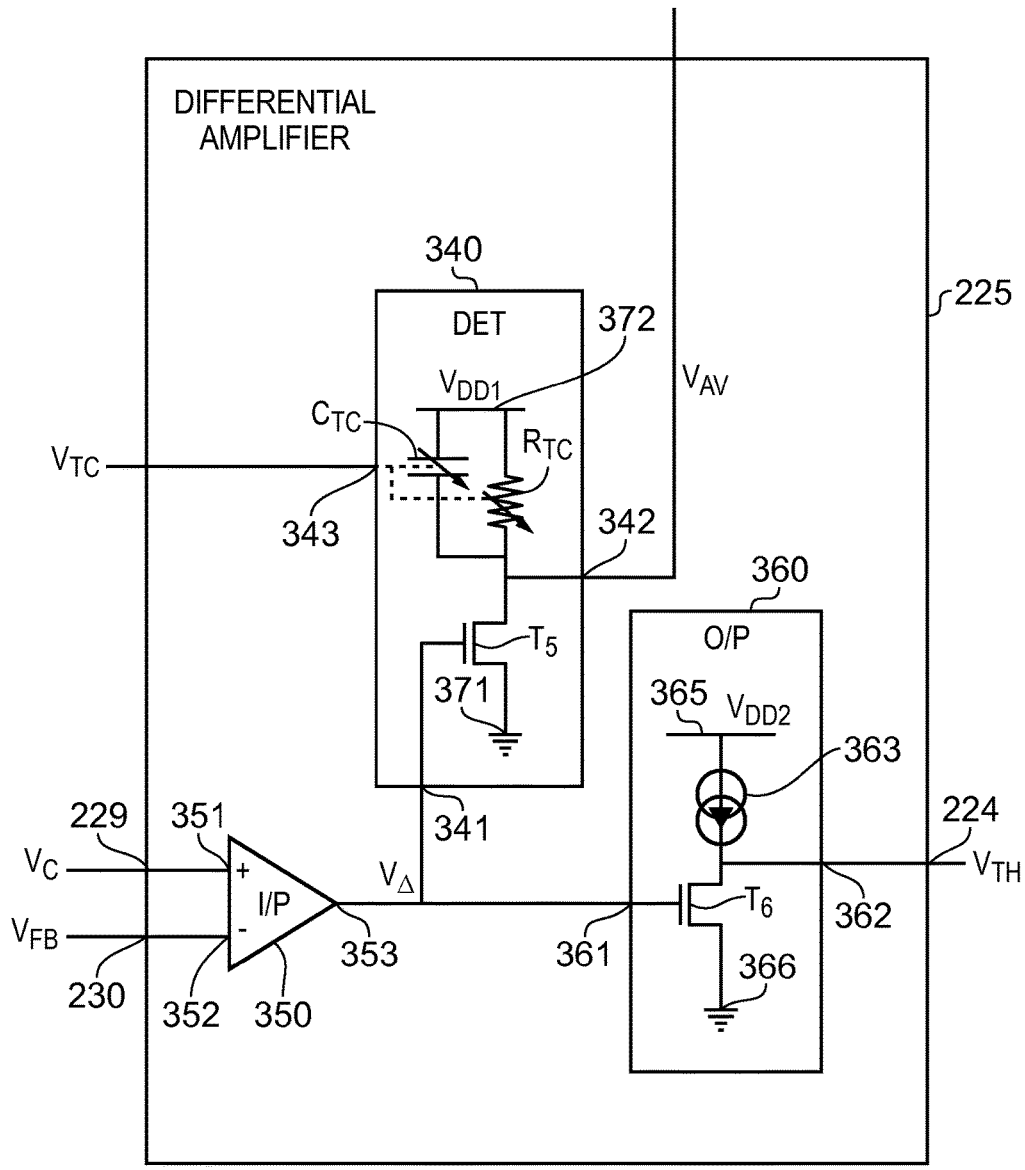
FIG. 4 is a schematic diagram of a differential amplifier.

FIG. 4 illustrates an embodiment of the differential amplifier 225 showing an example embodiment the detector stage 340 and an example embodiment of the output stage 360. Referring to FIG. 4, the detector stage 340 comprises a transistor $T_5$ having a drain coupled to the output 342 of the detector stage 340, a source coupled to a power supply rail 371, which may be ground, and a gate coupled to the first input 341 of the detector stage 340. A variable capacitance element $C_{TC}$ is coupled between the output 342 of the detector stage 340 and a power supply rail 372 at a voltage $V_{DD1}$. A variable resistance element $R_{TC}$ is also coupled between the output 342 of the detector stage 340 and the power supply rail 372. The capacitance of the variable capacitance element $C_{TC}$ and the resistance of the variable resistance element $R_{TC}$ is adjustable by means of the time constant control signal $V_{TC}$ present at the second input 343 of the detector stage 340. The output stage 360 comprises a transistor $T_6$ having a drain coupled to the output 362 of the output stage 360, a source coupled to a power supply rail 366, which may be ground, and a gate coupled to the input 361 of the output stage 360. A current source 363 is coupled between the output 362 of the output stage 360 and a power supply rail 365 at the voltage $V_{DD2}$.

Figure 5:
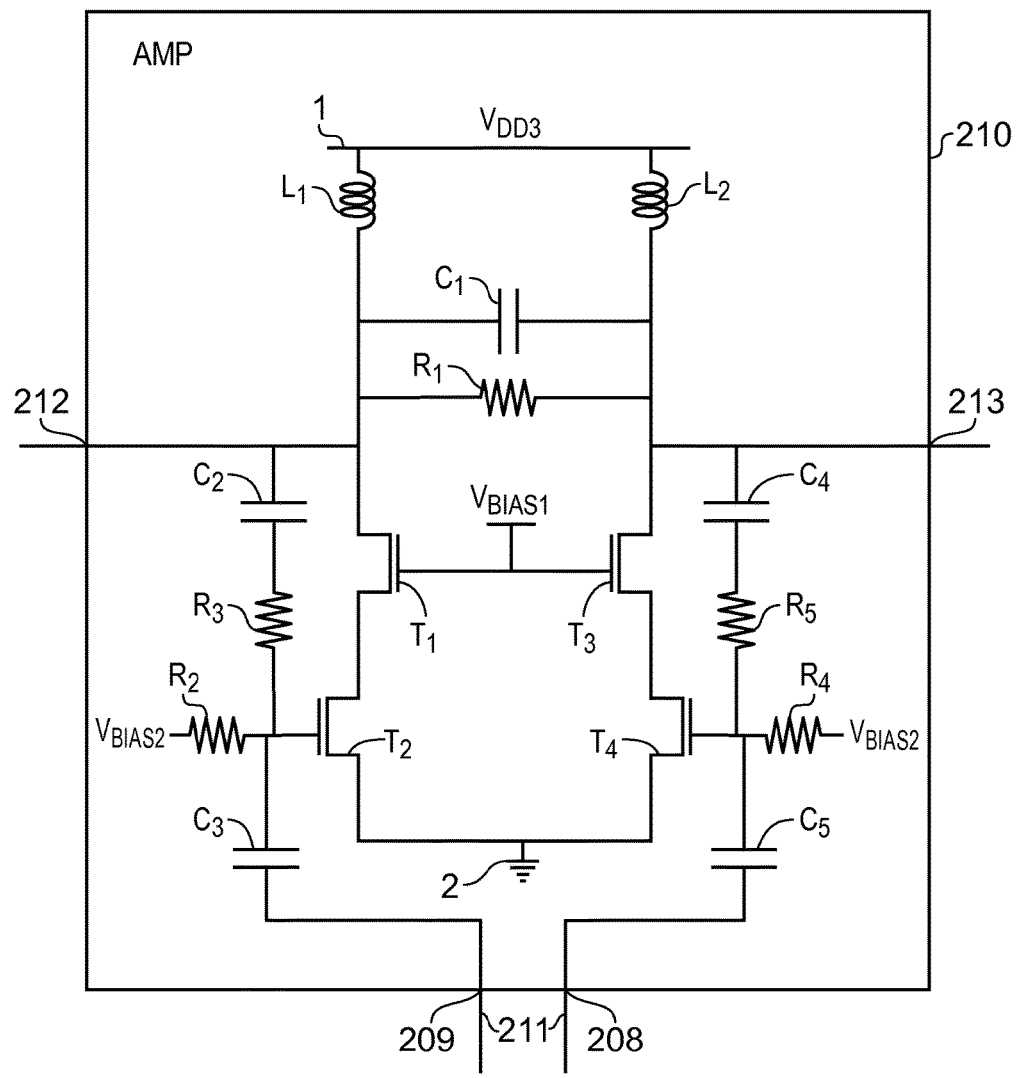
FIG. 5 is a schematic diagram of an amplifier circuit.

FIG. 5 illustrates an embodiment of the amplifier circuit 210 suitable for use in RFICs. Referring to FIG. 5, first and second transistors $T_1$, $T_2$ are configured as a cascode pair coupled between the first signal output 212 and ground 2, with the first transistor $T_1$ being an upper transistor and the second transistor $T_2$ being a lower transistor. A first bias voltage $V_{BIAS1}$ is applied to a gate of the first transistor $T_1$. A first inductive element $L_1$ is coupled between the first signal output 212 and a power supply rail 1 at a voltage $V_{DD3}$. A first capacitive element $C_1$ is coupled between the first signal output 212 and the second signal output 213. A first resistive element $R_1$ is also coupled between the first signal output 212 and the second signal output 213, and is a model of the loading of subsequent circuit blocks coupled to the first and second signal outputs 212, 213. A second bias voltage $V_{BIAS2}$ is applied to a gate of the second transistor $T_2$ via a second resistive element $R_2$. A second capacitive element $C_2$ is coupled in series with a third resistive element $R_3$ between the first signal output 212 and the gate of the second transistor $T_2$. A third capacitive element $C_3$ is coupled between the gate of the second transistor $T_2$ and the first signal input 208, thereby providing AC coupling of the first input signal component Third and fourth transistors $T_3$, $T_4$ are configured as a cascode pair coupled between the second signal output 213 and ground 2, with the third transistor $T_3$ being an upper transistor and the fourth transistor $T_4$ being a lower transistor. The second and fourth transistors $T_2$, $T_4$ form a common-source differential pair. The first and third transistors $T_1$, $T_3$ form cascode transistors for isolating the signal input 211 from the first and second signal outputs 212, 213. A first bias voltage $V_{BIAS1}$ is applied to a gate of the third transistor $T_3$. A second inductive element $L_2$ is coupled between the second signal output 213 and the power supply rail 1 at the voltage $V_{DD3}$. The second bias voltage $V_{BIAS2}$ is applied to a gate of the fourth transistor $T_4$ via a fourth resistive element $R_4$. A fourth capacitive element $C_4$ is coupled in series with a fifth resistive element $R_5$ between the second signal output 213 and the gate of the fourth transistor $T_4$. A fifth capacitive element $C_5$ is coupled between the gate of the fourth transistor $T_4$ and the second signal input 209, thereby providing AC coupling of the second input signal component $V_{i-}$.

The first and second inductive elements $L_1$, $L_2$ in conjunction with the first capacitive element $C_1$ constitute a resonator load and enable high output impedance of the amplifier circuit 210. The resonator load is tuneable by varying the capacitance of the first capacitive element $C_1$, which can contribute to extending the bandwidth of the amplifier circuit 210, and can contribute to suppressing unwanted interference having a frequency three times the frequency of the wanted input signal $V_i$, prior to down conversion of the amplified input signal $V_i$ in a subsequent stage. Resistive feedback provided by the third and fifth resistive elements $R_3$, $R_5$ determines the input impedance of the amplifier circuit 210. This impedance may be represented as $(R_3+R_5)/(G+1)$, where $R_3$ and $R_5$ represent the resistance of the third and fifth resistive elements $R_3$, $R_5$, and G represents the voltage gain of the amplifier circuit 210. The third and fifth resistive elements $R_3$, $R_5$ are large, with low noise contribution.

Figure 6:
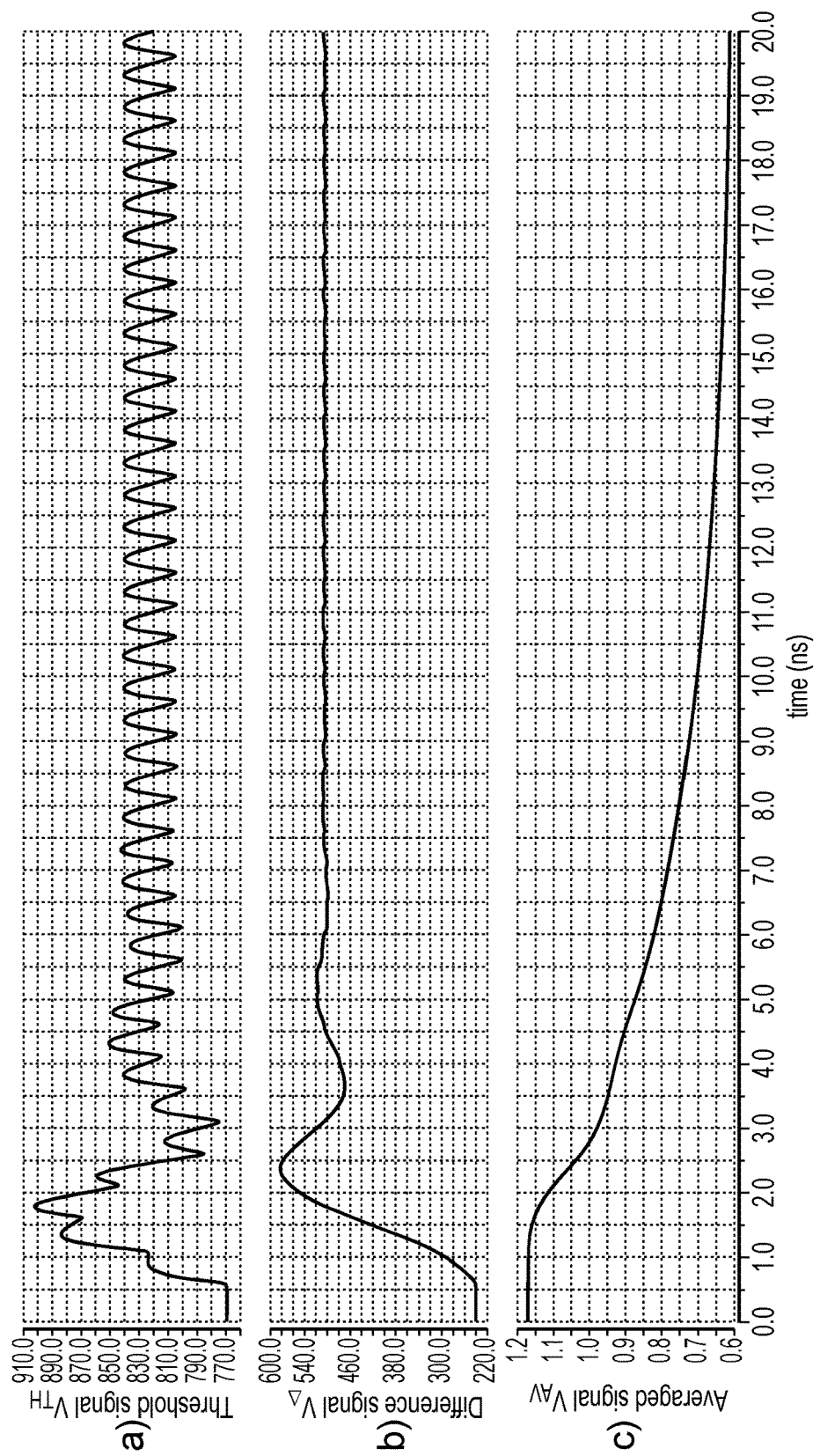
FIG. 6 is a graph illustrating the operation of an amplification device.

FIG. 6 is a graph showing voltages varying with time. Referring to FIG. 6, trace a) shows the threshold signal $V_{TH}$, which is the voltage across the capacitive element 226 of the amplification device 200 illustrated in FIG. 2, when the level of the input signal $V_i$ is increased at time zero, for example by the addition of an interfering signal to a wanted signal. Trace a) exhibits some fast ringing, caused by the rectified interfering signal, superimposed on a slower variation. Commencing at time zero, current injection into the limiter 220 through the first and second diodes 221, 235 causes charge to build up on the capacitive element 226, resulting in an error voltage between the first and second differential amplifier inputs 229, 230, which in turn increases the difference signal $V_A$. Trace b) shows the difference signal $V_A$ at the output 353 of the input stage 350, and which is applied to the gate of the transistor $T_6$ of the output stage 360, thereby increasing the current in the transistor $T_6$. After some initial ringing, the difference signal $V_A$ reaches steady state after about 10 ns, at which point the average current injected via the first and second diodes 221, 235 is counteracted by the current in the transistor $T_6$. Trace c) shows the averaged signal $V_{AV}$ generated by the detector stage 340 and which corresponds to an averaged, by low pass filtering, replica of a voltage at the output 362 of the output stage 360. The time constant for the averaging by the detector stage 340 is arranged to be higher than a response time of the differential input stage 350. Consequently, the averaged signal $V_{AV}$ reaches steady state more slowly than the difference signal $V_A$, after about 20 ns.

Figure 7:
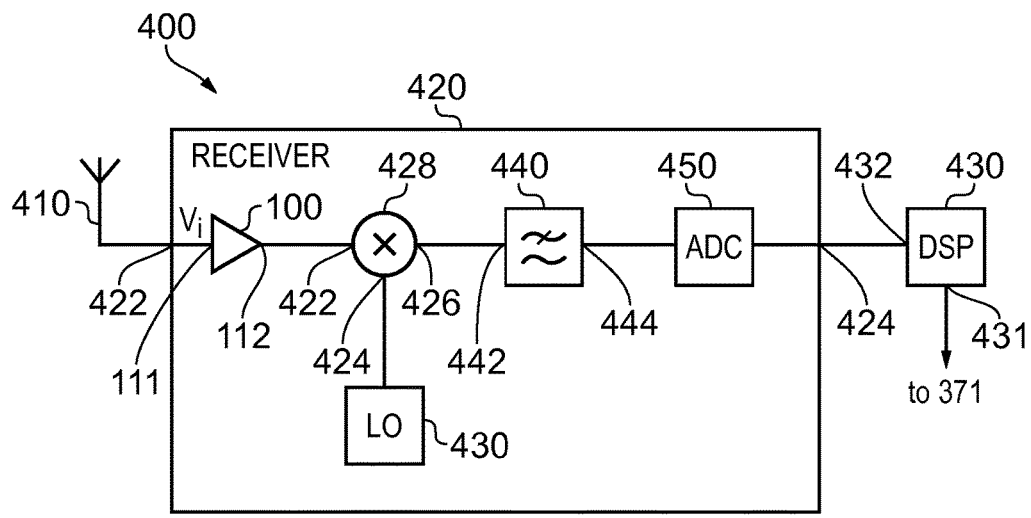
FIG. 7 is a schematic diagram of a receiving apparatus.

Referring to FIG. 7, a receiving apparatus 400 comprises an antenna 410 coupled to an input 422 of a receiver 420. An output 424 of the receiver 420 is coupled to an input 432 of a digital signal processor (DSP) 430. The receiver 420 comprises the amplification device 100 described with reference to FIG. 1, or alternatively may comprise the amplification device 200 or 300 described with reference to FIGS. 2 and 3 respectively. The input 422 of the receiver 420 is coupled to the signal input 111 of the amplification device 100 for receiving the input signal $V_i$ to be amplified, which is a signal detected by the antenna 410. The amplification device 100 provides low noise amplification of the input signal $V_i$ detected by the antenna 410.

The receiver 420 also comprises a mixer 428, a local oscillator signal generator (LO) 430, a filter 440, and an analogue to digital converter (ADC) 450. The first signal output 112 of the amplification device 100, and also the second signal output 113 if the amplification device 200 or 300 is alternatively employed, is coupled to a signal input 422 of the mixer 428. The local oscillator signal generator (LO) 430 is coupled to an oscillator input 424 of the mixer 428 for delivering a local oscillator signal. The mixer 428 down-converts the input signal $V_i$ after amplification by the amplification device 100, and delivers a down-converted signal at an output 426 of the mixer 428. The output 426 of the mixer 428 is coupled to an input 442 of the filter 440 for filtering the down-converted signal, and an output 444 of the filter 440 is coupled to the output 424 of the receiver 420 by means of the ADC 450. After digitisation of the down-converted and filtered signal in the ADC 450, the digitised signal is processed by the DSP 430 to extract information conveyed by the input signal $V_i$. The DSP 430 may be arranged to determine a signal-to-interference ratio of the first and/or second output signals $V_{O+}$, $V_{O-}$ after demodulation, and may comprise an optional output 431 coupled to the input 371 of the time constant controller 370 for delivering an indication of signal-to-interference ratio.

Figure 8:
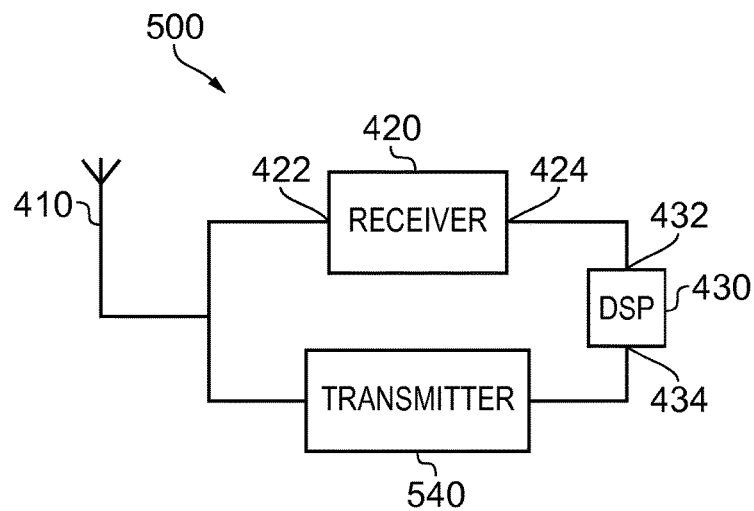
FIG. 8 is a schematic diagram of a radio communication apparatus.

Referring to FIG. 8, a radio communication apparatus 500 comprises the elements of the receiving apparatus 400 described with reference to FIG. 7, and additionally comprises a transmitter 540 coupled between an output 434 of the DSP 430 and the antenna 410 for transmitting a signal generated by the DSP 430.

Other variations and modifications will be apparent to the skilled person. Such variations and modifications may involve equivalent and other features that are already known and which may be used instead of, or in addition to, features described herein. For example, in other embodiments, the amplifier circuit 210 may be arranged to amplify an input signal $V_i$ that is a single ended signal, in which case the amplifier circuit 210 has a single input for receiving a single ended input signal.

Features that are described in the context of separate embodiments may be provided in combination in a single embodiment. Conversely, features that are described in the context of a single embodiment may also be provided separately or in any suitable sub-combination.

It should be noted that the term "comprising" does not exclude other elements or steps, the term "a" or "an" does not exclude a plurality, a single feature may fulfil the functions of several features recited in the claims and reference signs in the claims shall not be construed as limiting the scope of the claims. It should also be noted that where a component is described as being "arranged to" or "adapted to" perform a particular function, it may be appropriate to consider the component as merely suitable "for" performing the function, depending on the context in which the component is being considered. Throughout the text, these terms are generally considered as interchangeable, unless the particular context dictates otherwise. It should also be noted that the Figures are not necessarily to scale; emphasis instead generally being placed upon illustrating the principles of the present invention.

The invention claimed is:

1. An amplification device, comprising:
   an amplifier circuit comprising a signal input for an input signal to be amplified and a first signal output for a first output signal; and
   a limiter, wherein the limiter comprises:
     a differential amplifier comprising:
       a first differential amplifier input for a threshold control signal;
       a second differential amplifier input for a feedback signal; and
       a differential amplifier output for a threshold signal indicative of a difference between the threshold control signal and the feedback signal;
     a first diode having a first anode coupled to the first signal output and a first cathode coupled to the differential amplifier output; and
     a feedback stage coupled between the differential amplifier output and the second differential amplifier input, wherein the feedback stage is configured to generate the feedback signal dependent on the threshold signal.

2. The amplification device of claim 1, wherein the limiter comprises a threshold controller configured to generate the threshold control signal dependent on a property of the amplifier circuit.

3. The amplification device of claim 2, wherein the property of the amplifier circuit is temperature of the amplifier circuit.

4. The amplification device of claim 2, wherein the property of the amplifier circuit is an integrated circuit process corner of the amplifier circuit.

5. The amplification device of claim 1, wherein:
   the differential amplifier comprises a detector stage configured to generate an averaged signal indicative of an average of a difference between the threshold control signal and the feedback signal;
   the amplification device further comprises a gain control stage configured to generate a gain control signal dependent on the averaged signal; and
   the amplifier circuit is configured to have a gain dependent on the gain control signal.

6. The amplification device of claim 5, wherein the gain control stage is configured to control the gain control signal such that the gain of the amplifier circuit is:
   increased in response to the averaged signal being indicative of the input signal having a level below a lower signal level threshold;
   decreased in response to the averaged signal being indicative of the input signal having a level above an upper signal level threshold, and
   unchanged in response to the averaged signal being indicative of the input signal having a level between the lower signal level threshold and the upper signal level threshold.

7. The amplification device of claim 5:
   wherein the detector stage is configured to employ an adjustable time constant for generating the averaged signal; and
   wherein the limiter further comprises a time constant controller coupled to the detector stage and configured to adjust the adjustable time constant dependent on a property of the input signal to be amplified.

8. The amplification device of claim 7, wherein the property of the input signal is type of modulation.

9. The amplification device of claim 7, wherein the property of the input signal is signal-to-interference ratio.

10. The amplification of claim 5:
    wherein the differential amplifier comprises a differential input stage and an output stage;
    wherein a first input of the differential input stage is coupled to the first differential amplifier input and a second input of the differential input stage is coupled to the second differential amplifier input;
    wherein an input of the output stage is coupled to an output of the differential input stage and an output of the output stage is coupled to the difference output of the differential amplifier; and
    wherein the detector stage is coupled to the output of the differential input stage for determining the averaged signal.

11. The amplification device of claim 5, wherein the detector stage is configured to:
    replicate a current flowing in the output stage by generating a current proportional to a current flowing in the output stage;
    generate the averaged signal from the replica.

12. The amplification device of claim 1:
    wherein the amplifier circuit comprises a second signal output for a second output signal, the first and second output signals together forming a differential signal;
    wherein the limiter comprises a second diode having a second anode coupled to the second signal output and a second cathode coupled to the differential amplifier output.

13. The amplification device of claim 1, wherein the feedback stage comprises a capacitive element coupled between the differential amplifier output and a first voltage supply rail.

14. The amplification device of claim 1, wherein the feedback stage comprises:
    a first resistive element coupled between the differential amplifier output and the second differential amplifier input; and a second resistive element coupled between the second differential amplifier input and a second power supply rail.

15. The amplification device of claim 1, wherein the amplifier circuit is a low noise amplifier.

16. A receiving apparatus, comprising:
an amplification device, the amplification device comprising:
an amplifier circuit comprising a signal input for an input signal to be amplified and a first signal output for a first output signal; and
a limiter, wherein the limiter comprises:
a differential amplifier comprising:
a first differential amplifier input for a threshold control signal;
a second differential amplifier input for a feedback signal; and
a differential amplifier output for a threshold signal indicative of a difference between the threshold control signal and the feedback signal;
a first diode having a first anode coupled to the first signal output and a first cathode coupled to the differential amplifier output; and
a feedback stage coupled between the differential amplifier output and the second differential amplifier input, wherein the feedback stage is configured to generate the feedback signal dependent on the threshold signal.

17. A radio communication apparatus, comprising:
a receiving apparatus comprising an amplification device, the amplification device comprising:
an amplifier circuit comprising a signal input for an input signal to be amplified and a first signal output for a first output signal; and
a limiter, wherein the limiter comprises:
a differential amplifier comprising:
a first differential amplifier input for a threshold control signal;
a second differential amplifier input for a feedback signal; and
a differential amplifier output for a threshold signal indicative of a difference between the threshold control signal and the feedback signal;
a first diode having a first anode coupled to the first signal output and a first cathode coupled to the differential amplifier output; and
a feedback stage coupled between the differential amplifier output and the second differential amplifier input, wherein the feedback stage is configured to generate the feedback signal dependent on the threshold signal.

18. The radio communication apparatus of claim 17, wherein the radio communication apparatus is a base station.

* * * * *